(12) United States Patent
Ohzu et al.

(10) Patent No.: US 10,797,568 B2
(45) Date of Patent: Oct. 6, 2020

(54) MOTOR UNIT AND VEHICLE

(71) Applicant: HONDA MOTOR CO., LTD., Minato-Ku, Tokyo (JP)

(72) Inventors: Tatsuya Ohzu, Wako (JP); Yutaka Arimura, Wako (JP); Daisuke Hoshino, Wako (JP); Shingo Soma, Wako (JP); Yosuke Tanaka, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 16/360,426

(22) Filed: Mar. 21, 2019

(65) Prior Publication Data
US 2019/0296616 A1    Sep. 26, 2019

(30) Foreign Application Priority Data

Mar. 22, 2018 (JP) .................................. 2018-054298

(51) Int. Cl.
| | |
|---|---|
| *H02K 11/24* | (2016.01) |
| *H02K 7/00* | (2006.01) |
| *H02K 9/19* | (2006.01) |
| *H02K 21/14* | (2006.01) |
| *B60K 6/26* | (2007.10) |
| *B60K 6/48* | (2007.10) |
| *B60K 1/00* | (2006.01) |
| *H01L 41/12* | (2006.01) |
| *G01L 3/10* | (2006.01) |

(52) U.S. Cl.
CPC ............... *H02K 11/24* (2016.01); *B60K 1/00* (2013.01); *B60K 6/26* (2013.01); *B60K 6/48* (2013.01); *G01L 3/102* (2013.01); *H01L 41/125* (2013.01); *H02K 7/003* (2013.01); *H02K 7/006* (2013.01); *H02K 9/19* (2013.01); *H02K 21/14* (2013.01); *B60K 2001/006* (2013.01); *B60Y 2200/92* (2013.01)

(58) Field of Classification Search
CPC .................................. H02K 11/33; H02K 9/06
USPC .................................. 310/68 B, 75 R, 83, 98
See application file for complete search history.

(56) References Cited

U.S. PATENT DOCUMENTS

| | | | | |
|---|---|---|---|---|
| 2,403,579 | A | * 7/1946 | Carpenter | ........... F16H 57/0482 184/6.12 |
| 5,269,192 | A | * 12/1993 | Utsui | ....................... G01L 3/105 73/862.333 |
| 10,094,377 | B2 | * 10/2018 | Obata | ....................... F04C 2/00 |

(Continued)

FOREIGN PATENT DOCUMENTS

| | | |
|---|---|---|
| JP | 2004-340744 A | 12/2004 |
| JP | 2008-017549 A | 1/2008 |

(Continued)

OTHER PUBLICATIONS

MAchine Translation JP2012149939 (Year: 2012).*

*Primary Examiner* — Jose A Gonzalez Quinones
(74) *Attorney, Agent, or Firm* — Carrier Blackman & Associates, P.C.; Joseph P. Carrier; Jeffrey T. Gedeon

(57) ABSTRACT

A motor unit including a drive motor that includes an output shaft having a hollow portion; a torque sensor arranged within the hollow portion; and a cooling mechanism. The cooling mechanism has one end of a coolant path arranged inside the hollow portion and cools the drive motor and the torque sensor. A vehicle can include the motor unit. The drive motor can act as a traction motor generating traction drive force of the vehicle.

4 Claims, 5 Drawing Sheets

(56) References Cited

U.S. PATENT DOCUMENTS

| | | | |
|---|---|---|---|
| 10,337,603 B2* | 7/2019 | Nishimine | B60W 10/08 |
| 2001/0052735 A1* | 12/2001 | Sakamoto | H02K 13/003 |
| | | | 310/75 R |
| 2006/0108884 A1* | 5/2006 | Shiino | B60T 8/267 |
| | | | 310/89 |
| 2008/0000713 A1 | 1/2008 | Yoshioka et al. | |
| 2009/0233749 A1* | 9/2009 | Tomita | B60K 6/445 |
| | | | 475/159 |
| 2009/0266179 A1 | 10/2009 | Oniwa et al. | |
| 2010/0018328 A1* | 1/2010 | May | G01L 3/105 |
| | | | 73/862.193 |
| 2011/0076165 A1* | 3/2011 | Atarashi | B60K 6/26 |
| | | | 417/321 |
| 2011/0298314 A1* | 12/2011 | Atarashi | B60K 6/405 |
| | | | 310/54 |
| 2012/0143422 A1* | 6/2012 | Kitahata | F16H 57/0484 |
| | | | 701/22 |
| 2013/0283972 A1* | 10/2013 | Yamamoto | B60K 6/22 |
| | | | 74/665 B |
| 2013/0325237 A1* | 12/2013 | Ikegami | B60L 50/16 |
| | | | 701/22 |
| 2016/0355084 A1* | 12/2016 | Uozumi | B60B 27/00 |
| 2017/0158043 A1 | 6/2017 | Tsukamoto | |
| 2018/0118304 A1* | 5/2018 | Greven | B62M 6/75 |

FOREIGN PATENT DOCUMENTS

| | | | |
|---|---|---|---|
| JP | 2009-264812 A | | 11/2009 |
| JP | 2012149939 A | * | 8/2012 |
| JP | 2017-100590 A | | 6/2017 |

* cited by examiner

MOTOR UNIT AND VEHICLE

CROSS-REFERENCE TO RELATED APPLICATION

This application is based upon and claims the benefit of priority from Japanese Patent Application No. 2018-054298 filed on Mar. 22, 2018, the contents of which are incorporated herein by reference.

BACKGROUND OF THE INVENTION

Field of the Invention

The present invention relates to a motor unit including a torque sensor and a vehicle including the motor unit.

Description of the Related Art

In Japanese Laid-Open Patent Publication No. 2008-017549, it is an object to provide a vehicle steering apparatus that is formed to be small in the radial direction and axial direction of a steering shaft (see [0005] and the ABSTRACT). In order to achieve this object, according to Japanese Laid-Open Patent Publication No. 2008-017549 (see the ABSTRACT and FIGS. 1 and 2), an electric motor 14 included in an electric power steering apparatus includes a cylindrical rotor core 30. The rotor core 30 is arranged coaxially with an input shaft 7 and an output shaft 8, and a ring-shaped storage space S1 is formed around the shafts 7 and 8, inward in a radial direction Y1 thereof.

A torque sensor 12 for detecting steering torque input to a steering member is arranged coaxially with the shafts 7 and 8, and housed in the storage space S1. Furthermore, the rotor core 30 is formed by an electromagnetic shielding material such as iron that prevents the passage of electromagnetic noise. The torque sensor 12 arranged within the storage space S1 can operate stably without being affected by electromagnetic noise generated around the rotor core 30.

SUMMARY OF THE INVENTION

As described above, in Japanese Laid-Open Patent Publication No. 2008-017549 (see the ABSTRACT and FIGS. 1 and 2), the ring-shaped storage space S1 surrounding the input shaft 7 and output shaft 8 is formed inward in the radial direction Y1. Furthermore, the torque sensor 12 housed inside the storage space S1 is arranged coaxially with the shafts 7 and 8 (specifically on the outer circumferential sides of the shafts 7 and 8). However, there is room for improvement in the arrangement of the torque sensor 12.

For example, when the torque sensor 12 is arranged on the outer circumferential sides of the input shaft 7 and the output shaft 8, design restrictions concerning the axial direction are imposed in order to preserve the position where the torque sensor 12 is attached. Furthermore, in Japanese Laid-Open Patent Publication No. 2008-017549, there is no consideration of cooling the torque sensor in order to maintain the detection accuracy.

The present invention aims to solve the above problems, and it is an object of the present invention to provide a motor unit and a vehicle capable of improving the degree of design freedom and the detection accuracy relating to a torque sensor.

The motor unit according to the present invention comprises a drive motor that includes an output shaft having a hollow portion; a torque sensor arranged within the hollow portion; and a cooling mechanism that has one end of a coolant path arranged inside the hollow portion and cools the drive motor and the torque sensor.

According to the present embodiment, the torque sensor is arranged inside the hollow portion of the output shaft. Therefore, compared to a case where the torque sensor is arranged outside the output shaft, it is easier to use the outer circumference of the output shaft, such as by attaching the connecting portion for another shaft that engages with the output shaft near the drive motor or the torque sensor in a direction of the output shaft. Accordingly, it is possible to improve the degree of design freedom of the drive motor or the motor unit including this drive motor, in the axial direction.

The torque sensor is arranged inside the hollow portion of the output shaft, and therefore it is difficult for the torque sensor to contact components arranged around the drive motor. Accordingly, it is easier to protect the torque sensor from contact with these components.

Furthermore, due to the cooling mechanism in which part of the coolant flow path is arranged inside the hollow portion, the drive motor is cooled along with the torque sensor. Therefore, by cooling the drive motor along with the torque sensor, it is possible to restrict temperature fluctuation of the torque sensor. Accordingly, the detection accuracy of the torque sensor can be improved.

The cooling mechanism may include a pipe that is secured to a stator-side component of the drive motor, is arranged inside the output shaft, and allows a coolant to flow therethrough. The torque sensor may be a magnetostrictive torque sensor that includes a plurality of magnetostrictive layers arranged on an inner circumferential surface of the output shaft, and a plurality of coils arranged in the pipe. Due to this, the pipe for the coolant can also serve to support the coils of the torque sensor.

A through-hole that supplies the coolant between the plurality of magnetostrictive layers, in an axial direction of the drive motor, may be formed in the pipe. In this way, the coolant released from the through-hole of the pipe is supplied between the plurality of magnetostrictive layers, in the axial direction of the drive motor. As a result, it is possible to restrict unevenness in the supply of the coolant to the magnetostrictive layers. Accordingly, it is possible to prevent a drop in the detection accuracy caused by temperature unevenness between the magnetostrictive layers.

The output shaft may include a rotor shaft secured to a rotor of the drive motor, and a protruding shaft that protrudes from the rotor shaft. The magnetostrictive layers may be formed on an inner circumferential surface of the protruding shaft. A first through-hole overlapping with the rotor of the drive motor and a second through-hole overlapping with the plurality of magnetostrictive layers, in an axial direction of the drive motor, may be formed in the pipe. The protruding shaft may be closer to the pipe than the inner circumferential surface of the rotor shaft is. In this way, even when the coolant supplied to the inner circumferential surface of the rotor shaft from the first through-hole of the pipe has difficulty reaching the torque sensor, it is possible to improve the cooling efficiency of the torque sensor by supplying the coolant to the torque sensor from the second through-hole.

A vehicle according to the present invention comprises the motor unit described above, and the drive motor is a traction motor that generates traction drive force of the vehicle or a generator that generates power based on drive force of an internal combustion engine of the vehicle.

In this way, by directly detecting the output torque (during driving) from the rotor of the drive motor or the input torque (during power generation) to the rotor, it is possible to detect the output torque or the input torque with high accuracy. Accordingly, the traction drive force of the vehicle or the power generation by the generator can be controlled with high accuracy.

According to the present invention, it is possible to improve the degree of design freedom and the detection accuracy relating to a torque sensor.

The above and other objects features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A. Present Embodiment

<A-1. Configuration of the Present Embodiment>
[A-1-1. Overall Configuration]

Figure 1:
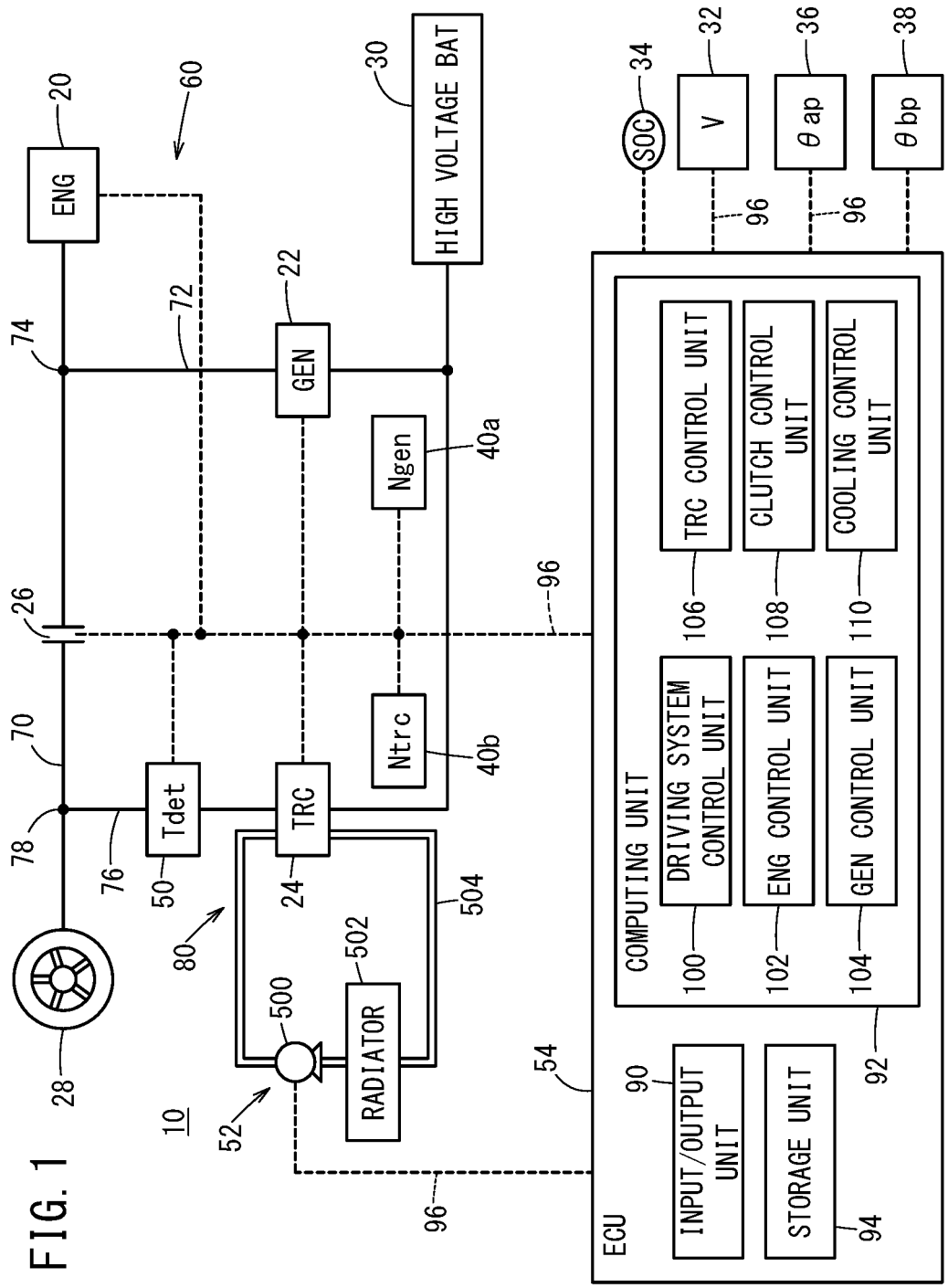
FIG. 1 shows a schematic configuration of a vehicle according to an embodiment of the present invention.

FIG. 1 shows a schematic configuration of a vehicle 10 according to an embodiment of the present invention. The vehicle 10 is a so-called hybrid vehicle. As shown in FIG. 1, the vehicle 10 includes an engine 20, a first rotating electric machine 22, a second rotating electric machine 24, an engine clutch 26, a wheel 28, a high voltage battery 30, a vehicle velocity sensor 32, an SOC sensor 34, an AP manipulation amount sensor 36, a BP manipulation amount sensor 38, rotational speed sensors 40a and 40b, a torque sensor 50, a cooling mechanism 52, and an electronic control unit 54 (referred to below as the "ECU 54").

In the following, the engine 20, the first rotating electric machine 22, the second rotating electric machine 24, and the engine clutch 26 are referred to collectively as a drive system 60. Furthermore, a drive force transmission path connecting the engine 20 and the wheel 28 is referred to as a first transmission path 70. The first transmission path 70 transmits torque Teng generated by the engine 20 to the wheel 28. Furthermore, a drive force transmission path connecting the first rotating electric machine 22 and a first branching point 74 on the engine 20 side of the engine clutch 26 in the first transmission path 70 is referred to as a second transmission path 72. Yet further, a drive force transmission path connecting the second rotating electric machine 24 and a second branching point 78 on the wheel 28 side of the engine clutch 26 in the first transmission path 70 is referred to as a third transmission path 76. In addition, the second rotating electric machine 24, the torque sensor 50, and the cooling mechanism 52 may be referred to collectively as a motor unit 80.

Figure 2:
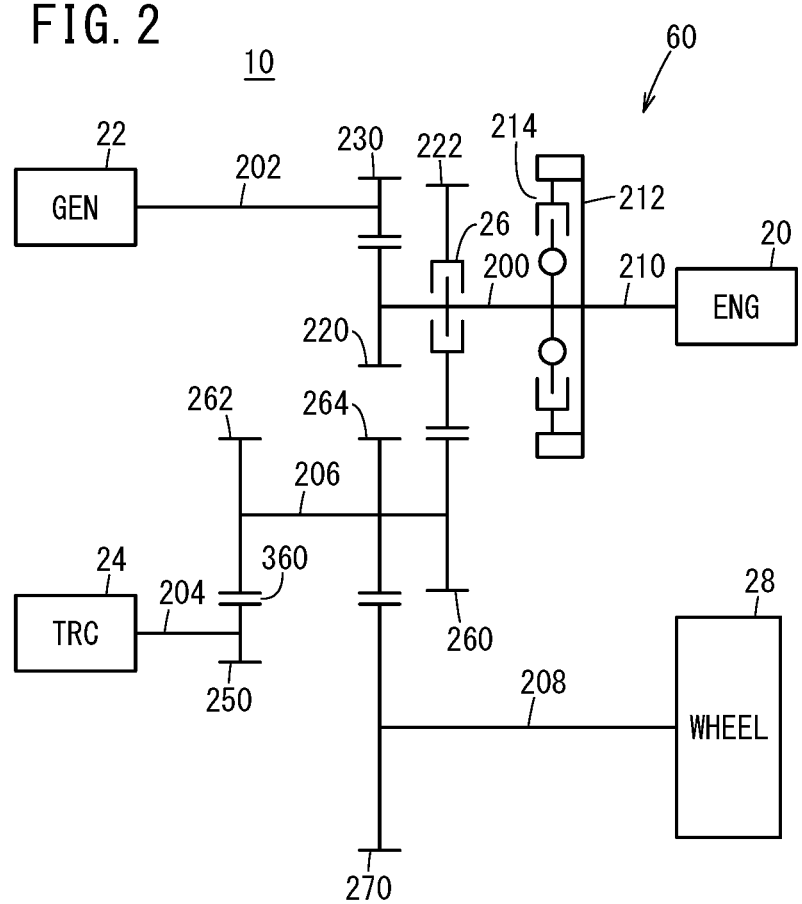
FIG. 2 schematically shows mechanical connection relationships of a drive system according to the present embodiment.

FIG. 2 schematically shows mechanical connection relationships of the drive system 60 according to the present embodiment. As shown in FIG. 2, the drive system 60 includes an engine shaft 200, a generator shaft 202, a motor shaft 204, a counter shaft 206, and a wheel output shaft 208. The engine 20 is connected to the engine shaft 200, via a crank shaft 210, a drive plate 212, and a damper 214. The engine clutch 26, a first engine shaft gear 220, and a second engine shaft gear 222 are arranged on the engine shaft 200.

The generator shaft 202 includes a generator shaft gear 230 that engages with the first engine shaft gear 220 of the engine shaft 200. The motor shaft 204 includes a motor shaft gear 250 that engages with a second counter shaft gear 262 of the counter shaft 206. The counter shaft 206 includes a first counter shaft gear 260, the second counter shaft gear 262, and a third counter shaft gear 264.

The first counter shaft gear 260 engages with the second engine shaft gear 222 of the engine shaft 200. The second counter shaft gear 262 engages with the motor shaft gear 250 of the motor shaft 204. The third counter shaft gear 264 engages with an output shaft gear 270 of the wheel output shaft 208. A differential apparatus, not shown in the drawings, is provided to the wheel output shaft 208. Each shaft 200, 202, 204, 206, and 208 is a torque transmission shaft that transmits torque to the wheel 28.

When the engine 20 operates while the engine clutch 26 is in a disconnected state, the generator 22 generates power due to the engine torque Teng. When the engine 20 operates while the engine clutch 26 is in a connected state, the engine torque Teng is transmitted to the wheel 28 via the engine shaft 200, the counter shaft 206, and the wheel output shaft 208. When the engine clutch 26 is in the connected state, the generator 22 may generate power due to the engine torque Teng, or the generator 22 itself may generate torque Tgen for driving the vehicle.

When the traction motor 24 operates while the engine clutch 26 is in the disconnected state, motor torque Ttrc is transmitted to the wheel 28 via the motor shaft 204, the counter shaft 206, and the wheel output shaft 208. When the vehicle 10 decelerates, regeneration torque Treg is input to the second motor 24 through the opposite path, so that the motor 24 regenerates. Furthermore, when the engine 20 and the traction motor 24 operate while the engine clutch 26 is in the connected state, the engine torque Teng and the motor torque Ttrc are transmitted to the wheel 28.

The configuration of the drive system 60 is not limited to the configuration shown in FIG. 2. For example, a configuration similar to the configuration described in Japanese Laid-Open Patent Publication No. 2017-100590, for example, may be used for the drive system 60 (see FIG. 2, for example, in Japanese Laid-Open Patent Publication No. 2017-100590).

[A-1-2. Engine 20]

The engine 20 (rotational drive source) generates the engine torque Teng (force Feng) as a first drive source for travel of the vehicle 10, and supplies this engine torque Teng to the wheel 28. Furthermore, the engine 20 generates power by operating the first rotating electric machine 22 with the engine torque Teng. Below, "ENG" or "eng" is appended to parameters relating to the engine 20. In FIG. 1 and the like, the engine 20 is indicated by "ENG".

[A-1-3. First Rotating Electric Machine 22]

The first rotating electric machine 22 (rotational drive source) is a three-phase AC brushless type, and functions as a generator that generates power with the engine torque Teng. The power Pgen generated by the first rotating electric machine 22 is supplied via a first inverter (not shown in the drawings) to the high voltage battery 30 (referred to below as the "battery 30") or the second rotating electric machine 24, or to the electric auxiliary equipment (not shown in the drawings). The first rotating electric machine 22 is an interior permanent magnet synchronous motor (IPMSM). The first rotating electric machine 22 includes a stator and a rotor, not shown in the drawings.

Below, the first rotating electric machine 22 is also referred to as a generator 22. The first rotating electric machine 22 may function as a traction motor, in addition to or instead of functioning as a generator. Below, "GEN" or "gen" is appended to parameters relating to the generator 22. Furthermore, in FIG. 1 and the like, the generator 22 is indicated by "GEN". The first rotating electric machine 22 can be used as the stator motor of the engine 20.

[A-1-4. Second Rotating Machine 24]

Figure 3:
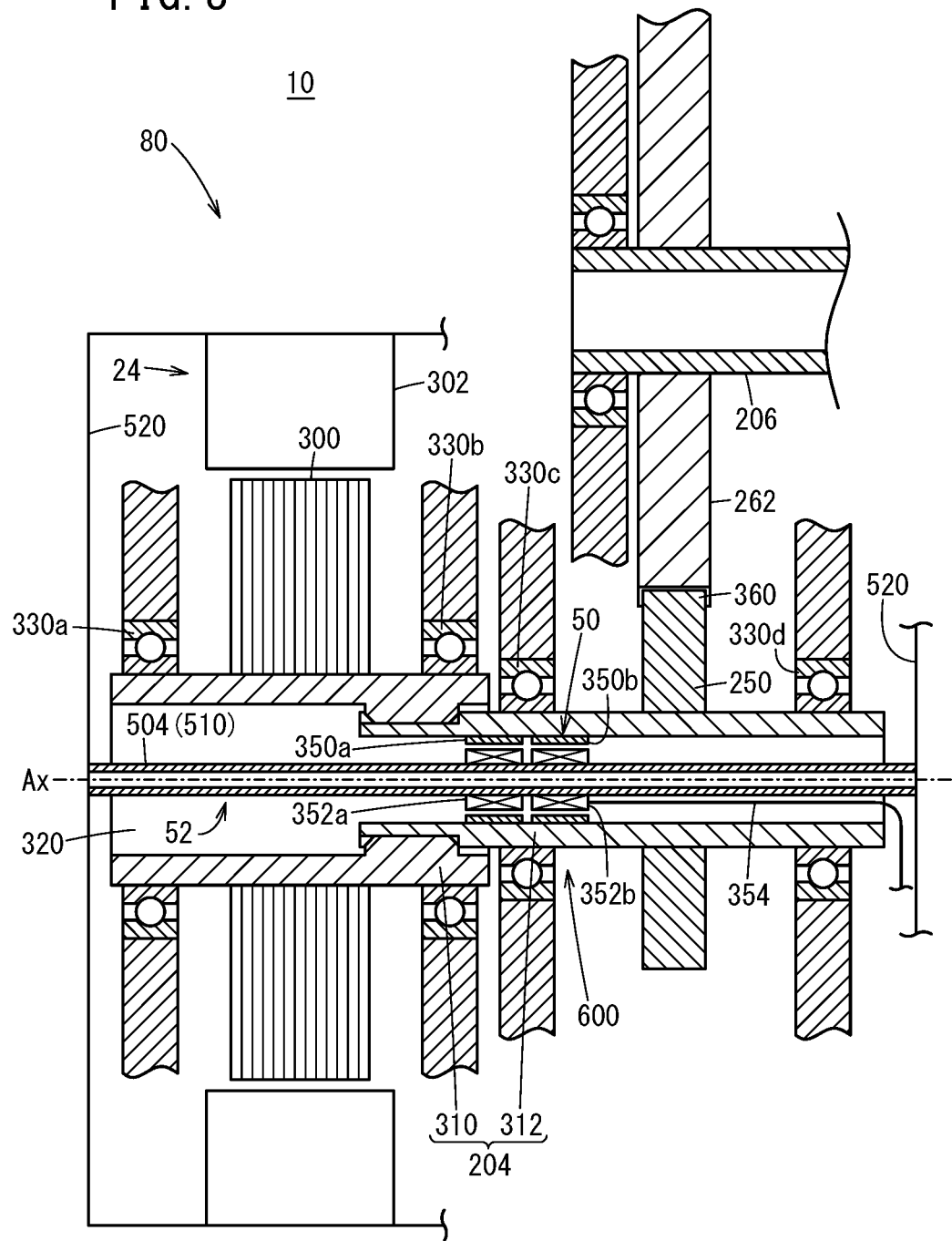
FIG. 3 is a cross-sectional view of a second rotating electric machine and a torque sensor of the motor unit, along with the surrounding region, according to the present embodiment.
Figure 4:
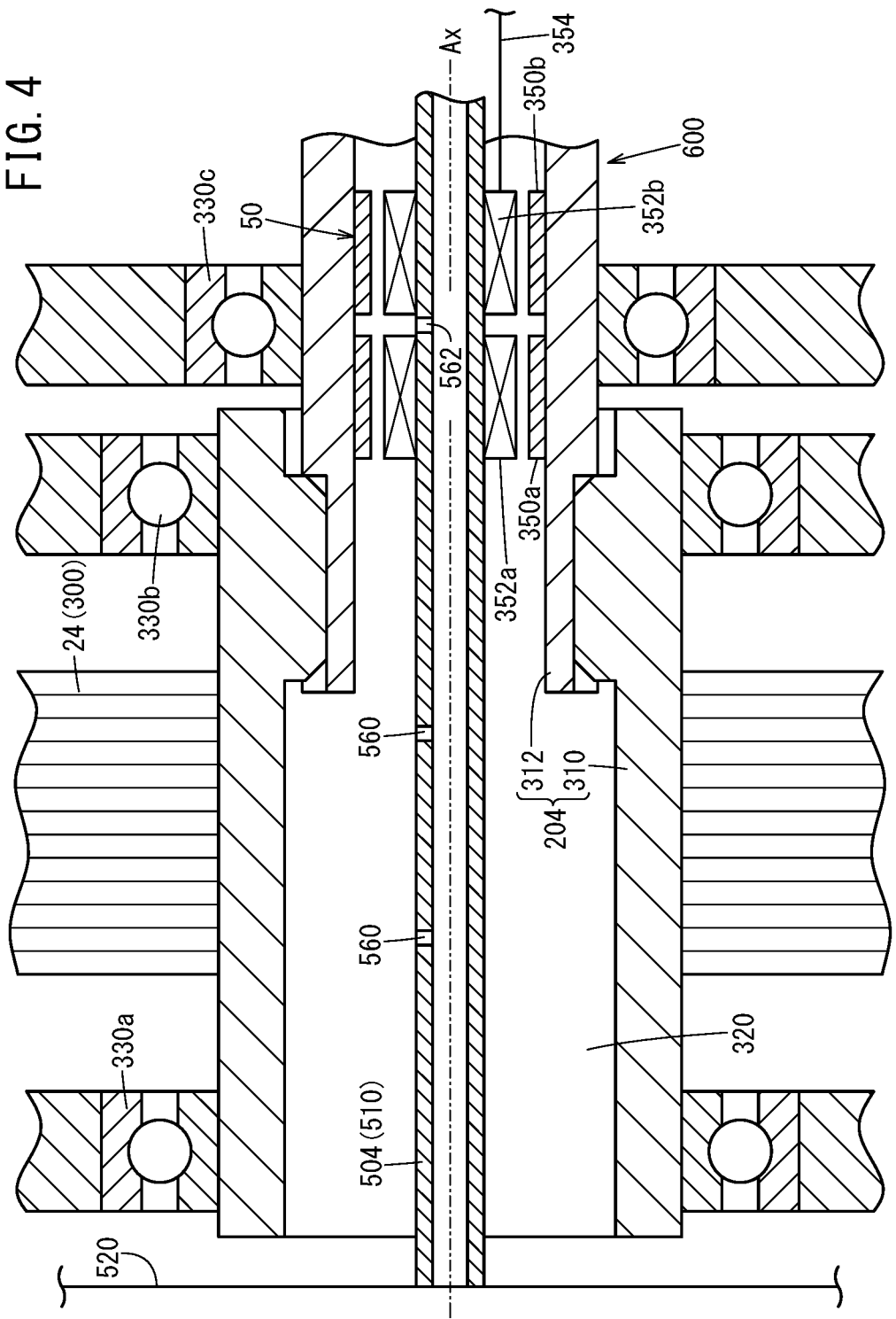
FIG. 4 is an enlarged view of a portion shown in FIG. 3.

FIG. 3 is a cross-sectional view of the torque sensor 50 and the second rotating machine 24 of the motor unit 80 according to the present embodiment, as well as the region around these components. FIG. 4 is an enlarged view of a portion of the region shown in FIG. 3. The second rotating electric machine 24 is a three-phase AC brushless type that generates a motor torque Ttrc (traction drive force) serving as a second drive source for travel of the vehicle 10 and supplies this motor torque Ttrc to the wheel 28 (driven wheel) side. In other words, the second rotating electric machine 24 functions as a traction motor that is driven by one or both of the power Pbat from the high voltage battery 30 and the power Pgen from the first rotating electric machine 22. Furthermore, the second rotating electric machine 24 performs regeneration when the vehicle 10 brakes, and supplies the battery 30 with regeneration power Preg via a second invertor, not shown in the drawings. The regeneration power Preg may be supplied to the electric auxiliary equipment 58 (not shown in the drawings). In the same manner as the first rotating electric machine 22, the second rotating electric machine 24 is an interior permanent magnet synchronous motor (IPMSM).

Below, the second rotating electric machine 24 is also referred to as a motor 24, a traction motor 24, or TRC motor 24. The second rotating electric machine 24 may function as a generator, in addition to or instead of functioning as a traction motor. Below, "TRC" or "trc" is appended to parameters relating to the traction motor 24. Furthermore, in FIG. 1 and the like, the traction motor 24 is indicated by "TRC".

As shown in FIG. 3, the traction motor 24 includes the rotor 300 and the stator 302 in addition to the motor shaft 204. The rotor 300 rotates centered on a rotational axis Ax. The motor shaft 204 (referred to below as the "output shaft 204" or the "motor output shaft 204") includes a rotor shaft 310 arranged inside the rotor 300 and a protruding shaft 312 joined to the rotor shaft 310. In the present embodiment, the protruding shaft 312 is press-fitted into the rotor shaft 310. The output shaft 204 is hollow. In other words, the motor shaft 204 includes a hollow portion 320. In the present embodiment, the torque sensor 50 and a pipe 510 of the cooling mechanism 52 are arranged inside the hollow portion 320 of the output shaft 204.

Furthermore, the motor shaft 204 is formed by a magnetic body. The magnetic body is carbon steel or a steel alloy (chrome steel, chrome molybdenum steel, or the like). The motor shaft 204 is rotatably supported by bearings 330a, 330b, 330c, and 330d.

[A-1-5. Engine Clutch 26]

As shown in FIG. 1, the engine clutch 26 (first switching apparatus) is arranged in the first transmission path 70, and switches between a connected state and a disconnected state between the engine 20 and the wheel 28, based on instructions from the ECU 54.

[A-1-6. High Voltage Battery 30]

The high voltage battery 30 is a power storage apparatus (energy storage device) capable of outputting a high voltage (hundreds of volts) and includes a plurality of battery cells, and a lithium ion secondary battery, a nickel hydrogen secondary battery, a solid state battery, or the like can be used as the high voltage battery 30, for example. Instead of or in addition to the high voltage battery 30, a power storage device such as a capacitor can be used.

[A-1-7. Various Sensors]

The vehicle velocity sensor 32 detects the vehicle velocity V [km/h] of the vehicle 10, and transmits this vehicle velocity to the ECU 54. The SOC sensor 34 is formed by a current sensor or the like, not shown in the drawings, detects the state of charge (SOC) of the battery 30, and transmits this SOC to the ECU 54.

The AP manipulation amount sensor 36 detects the depression amount (AP manipulation amount θap) [deg] or [%] of an acceleration pedal, not shown in the drawings, from an original position, and transmits this depression amount to the ECU 54. The BP manipulation amount sensor 38 detects the depression amount (BP manipulation amount θbp) [deg] or [%] of a brake pedal, not shown in the drawings, from an original position, and transmits this depression amount to the ECU 54.

The rotational speed sensor 40a detects the rotational speed Ngen [rpm] of the generator 22 as a number of rotations per unit time, and transmits this rotational speed Ngen to the ECU 54. The rotational speed sensor 40b detects the actual rotational speed Ntrc [rpm] of the traction motor 24 as a number of rotations per unit time, and transmits this actual rotational speed Ntrc to the ECU 54.

The torque sensor 50 is provided between the traction motor 24 and the second branching point 78 in the third transmission path 76, and detects the torque Tdet (also referred to below as the "detection torque Tdet"). As shown in FIGS. 3 and 4, the torque sensor 50 includes a plurality of magnetostrictive layers 350a and 350b, and a plurality of coils 352a and 352b. The details of the torque sensor 50 are described further below with reference to FIGS. 3 and 4.

[A-1-8. Cooling Mechanism 52]

The cooling mechanism 52 cools the motor 24 from the inside. As shown in FIG. 1, the cooling mechanism 52 includes a pump 500 that circulates coolant, a radiator 502 that cools the coolant, and a coolant flow path 504. The coolant flow path 504 is a flow path for circulating the coolant. The cooling mechanism 52 includes a pipe 510 (support rod) shown in FIGS. 3 and 4, as part of the coolant flow path 504. The pipe 510 is arranged inside the hollow portion 320 of the motor output shaft 204, coaxially with the motor output shaft 204, and allows the coolant to flow therethrough. More specifically, the pipe 510 passes through the inside of the motor output shaft 204 to have both ends thereof secured to a motor housing 520 (external component). A guide rod (not shown in the drawings) that facilitates the passage of the pipe 510 through the inside of the motor output shaft 204 may be provided. In the present embodiment, the coolant flowing through the pipe 510 flows from the left side to the right side in FIGS. 3 and 4. Alternatively, the coolant may flow from the right side to the left side in FIGS. 3 and 4.

As shown in FIG. 4, the pipe 510 is provided with a first through-hole 560 for the second rotating electric machine 24 and a second through-hole 562 for the torque sensor 50. The first through-hole 560 is arranged at a position overlapping with the rotor 300 and the stator 302, in the axial direction of the second rotating electric machine 24. Accordingly, the coolant released from the first through-hole 560 cools the rotor 300 and the stator 302.

The second through-hole 562 is arranged at a position overlapping with the torque sensor 50, in the axial direction of the second rotating electric machine 24. Accordingly, the coolant released from the second through-hole 562 cools the torque sensor 50. In particular, the second through-hole 562 of the present embodiment is arranged between the plurality of magnetostrictive layers 350a and 350b, in the axial direction of the second rotating electric machine 24, as shown in FIG. 4. In this way, the coolant is provided between the plurality of magnetostrictive layers 350a and 350b. It should be noted that, in FIG. 3, the first through-hole 560 and the second through-hole 562 are omitted from the drawing.

The pipe 510 of the present embodiment is formed by a nonmagnetic body. Here, stainless steel, aluminum, or engineering plastic, for example, can be used as the nonmagnetic body.

[A-1-9. ECU 54]

The ECU 54 is a control apparatus (or control circuit) that controls the entire drive system 60, and includes an input/output unit 90, a computing unit 92, and a storage unit 94. The input/output unit 90 performs input and output of signals with each unit of the vehicle 10, via signal lines 96 (communication lines). The input/output unit 90 includes an A/D conversion circuit, not shown in the drawings, that converts analog signals input thereto into digital signals.

The computing unit 92 includes a central processing unit (CPU) and operates according the execution of a program stored in the storage unit 94. A portion of the functions performed by the computing unit 92 can be realized using a logic IC (Integrated Circuit). The program may be supplied from the outside, via a wireless communication apparatus (mobile telephone, smart phone, or the like), not shown in the drawings. The computing unit 92 can configure a portion of the program with hardware (circuit components).

As shown in FIG. 1, the computing unit 92 includes a driving system control unit 100, an engine control unit 102, a generator control unit 104, a traction motor control unit 106, a clutch control unit 108, and a cooling control unit 110.

The driving system control unit 100 controls driving systems of the vehicle 10. Here, the driving systems include a driving system using the engine 20, a driving system using the traction motor 24, and a driving system using the engine 20 and the traction motor 24. At this time, the driving system control unit 100 also controls power generation by the generator 22 or regeneration (power generation) by the traction motor 24.

The engine control unit 102 (also referred to below as the "ENG control unit 102") controls the engine 20 based on instructions from the driving system control unit 100. The generator control unit 104 (also referred to below as the "GEN control unit 104") controls the generator 22 based on instructions from the driving system control unit 100. The traction motor control unit 106 (also referred to below as the "TRC control unit 106") controls the traction motor 24 based on instructions from the driving system control unit 100. The clutch control unit 108 controls the engine clutch 26 based on instructions from the driving system control unit 100. The cooling control unit 110 controls the pump 500 based on temperature or the like of the second rotating electric machine 24 detected by a temperature sensor (not shown in the drawings).

The storage unit 94 stores programs and data used by the computing unit 92, and includes a random access memory (RAM). A volatile memory such as a register and a non-volatile memory such as a flash memory can be used as the RAM. Furthermore, the storage unit 94 may include a read only memory (ROM), in addition to the RAM.

[A-1-10. Details of the Torque Sensor 50]

As described above, the torque sensor 50 is provided between the traction motor 24 and the second branching point 78 in the third transmission path 76, and detects the torque Tdet (detection torque Tdet). In other words, the torque sensor 50 is arranged between the rotor 300 and the connecting portion 360 (see FIGS. 2 and 3) that connects the motor shaft 204 and the counter shaft 206, and detects the torque Tdet. Furthermore, as shown in FIGS. 3 and 4, the torque sensor 50 is a magnetostrictive sensor arranged within the hollow portion 320 of the motor shaft 204, for example. In the following, the torque sensor 50, the motor shaft 204 (shaft), and the pipe 510 may be referred to collectively as a sensor unit 600.

Specifically, the torque sensor 50 includes the plurality of magnetostrictive layers 350a and 350b, a plurality of coils 352a and 352b, and a wire 354. The magnetostrictive layers 350a and 350b (magnetostrictive films) are arranged on the inner circumferential surface of the motor shaft 204. The magnetostrictive layers 350a and 350b are formed by plating. Alternatively, the magnetostrictive layers 350a and 350b may be formed by grooves created by nulling, magnetostrictive metal films attached by an adhesive, or ring-shaped magnetostrictive metal elements that are press-fitted.

The coils 352a and 352b are arranged in the pipe 510 (support rod). The magnetostrictive layers 350a and 350b and the coils 352a and 352b of the torque sensor 50 are arranged at positions overlapping with the bearing 330c, in the axial direction of the motor 24 (see FIGS. 3 and 4). For the specific configurations of the magnetostrictive layers 350a and 350b and the coils 352a and 352b, the configurations recorded in Japanese Laid-Open Patent Publication No. 2009-264812 can be used, for example. Alternatively, the torque sensor 50 can be formed using only a single magnetostrictive layer and a single coil.

The wire 354 has one end connected to the coils 352a and 352b, and outputs the detection results of the coils 352a and 352b to the ECU 54. The wire 354 of the present embodiment is lead in a direction away from the motor 24, more specifically to a side opposite the second rotating electric machine 24 (to the right side in FIG. 3). The wire 354 forms a portion of the signal line 96 of FIG. 1.

If the magnetostrictive layers 350a and 350b are formed by plating, it is possible to form these layers as described below. Basically, magnetostrictive material exhibiting a positive magnetostrictive constant, such as nickel steel plating, for example, is formed with a prescribed thickness (e.g. less than or equal to 30 microns) at two locations on the inner circumferential surface of the motor shaft 204. At this time, the motor shaft 204 undergoes high frequency heating in a state where a specific torque is applied thereto, after which the magnetostrictive layers 350a and 350b are made magnetically anisotropic in respectively opposite directions by returning the motor shaft 204 to room temperature and removing the torque. In this way, even in a case where the motor torque Ttrc (torsional torque) is not applied to the magnetostrictive layers 350a and 350b, stress is constantly applied and tensile distortion is added, such that the hysteresis in the reverse magnetostrictive characteristics is decreased.

The coils 352a and 352b each include an excitation coil and a detection coil. The excitation coils are connected to an excitation voltage supply source (not shown in the drawings) via the wire 354. The detection coils are arranged at a very short prescribed distance from the magnetostrictive layers 350a and 350b.

When the motor torque Ttrc (torsional torque) acts on the motor shaft 204, this motor torque Ttrc also acts on the magnetostrictive layers 350a and 350b, such that the magnetostrictive layers 350a and 350b experience a reverse magnetostrictive effect according to the motor torque Ttrc. Therefore, when a high frequency alternate current voltage (excitation voltage) is applied to the excitation coils from the excitation voltage supply source, the change in the magnetic field caused by the reverse magnetostrictive effect of the magnetostrictive layers 350a and 350b based on the motor torque Ttrc can be detected by the detection coils as a change in impedance or induction voltage. At this time, the magnetostrictive layers 350a and 350b are in a state where a constant tensile stress is applied thereto, in addition to the motor torque Ttrc (torsional torque). Therefore, a small hysteresis characteristic is obtained, and it is possible to detect the motor torque Ttrc applied to the motor shaft 204 from this change in impedance or induction voltage.

For the detection coil of the coil 352a, impedance or induction voltage increases as the motor torque Ttrc changes from negative to positive. The impedance or induction voltage reaches a peak value P10 when the motor torque Ttrc is a positive specified value T1, and decreases when the motor torque Ttrc exceeds this specified value T1. Furthermore, in an opposite manner, the motor torque Ttrc gradually decreases from having a large value, and the tensile stress is also applied when the motor torque Ttrc reaches zero. Therefore, the magnetic state of the magnetostrictive layer 350a is stabilized, and the change of the magnetic characteristics relative to the motor torque Ttrc is also stabilized. Accordingly, the hysteresis becomes small.

Furthermore, for the detection coil of the coil 352b, impedance or induction voltage increases as the motor torque Ttrc changes from positive to negative. The impedance or induction voltage reaches a peak value P10 when the motor torque Ttrc is a negative specified value -T1, and decreases as the motor torque Ttrc becomes more negative. Furthermore, when the motor torque Ttrc decreases from a state where the motor torque Ttrc is already small (i.e. a state where the motor torque Ttrc has become more negative), the direction of the magnetic domain in the magnetostrictive layer 350b changes. At this time, tensile stress is still being applied despite the motor torque Ttrc having become zero. Therefore, the magnetic state of the magnetostrictive layer 350b is stabilized, and the change of the magnetic characteristics relative to the motor torque Ttrc is also stabilized. Accordingly, the hysteresis becomes small.

The characteristics (torque-impedance characteristics) between the motor torque Ttrc and the impedance (or induction voltage) obtained at the detection coils of the coils 352a and 352b exhibit a substantially convex shape with small hysteresis. Furthermore, as described above, the magnetostrictive layers 350a and 350b are respectively provided with magnetic anisotropy in opposite directions. Therefore, the torque-impedance characteristics of the respective detection coils of the coils 352a and 352b substantially have linear symmetry with respect to the axis where the motor torque Ttrc is zero.

The following describes a torque sensor 50 manufacturing method. After the magnetostrictive layers 350a and 350b (magnetostrictive films formed by plating) are formed on the motor shaft 204, during a thermal treatment, a prescribed torsional torque is applied to the motor shaft 204, thereby providing magnetic anisotropy in prescribed directions to the magnetostrictive layers 350a and 350b. At this time, the thermal treatment is heating for a prescribed time using high frequency heating. Furthermore, the magnetostrictive layers 350a and 350b are preferably formed by a material whose main component is iron nickel.

The torque sensor 50 manufacturing method includes a magnetostrictive film formation step, a torque application and high frequency heating step, a torque removal step, and a coil arrangement step. In the magnetostrictive film formation step, the magnetostrictive layers 350a and 350b (magnetostrictive films) are provided as plating on the motor shaft 204.

In the torque application and high frequency heating step, heating is performed for a prescribed time using high frequency heating, in a state where a prescribed torsional torque is applied to the motor shaft 204. Specifically, in a state where the prescribed torsional torque is applied to the motor shaft 204 on which the magnetostrictive layers 350a and 350b are formed, the regions around the magnetostrictive layers 350a and 350b are surrounded by a first working coil and a second working coil. High frequency current is then made to flow through these working coils to heat the magnetostrictive layers 350a and 350b.

In the torque removal step, the magnetostrictive films are provided with magnetic anisotropy, by removing the torsional torque. Specifically, after naturally cooling the magnetostrictive layers 350a and 350b that have been heated in the torque application and high frequency heating step, the torsional torque is removed. Due to this, the magnetostrictive layers 350a and 350b are provided with magnetic anisotropy.

In the coil arrangement step, the multi-coiled coils 352a and 352b (excitation coils and detection coils) that detect change in the magnetic characteristics around the magnetostrictive layers 350a and 350b are arranged. As a result of the above steps, the magnetostrictive torque sensor 50 is formed.

The following is a more detailed description of the torque application and high frequency heating step. The material of the motor shaft 204 is chrome molybdenum steel (JIS-G-4105, code: SCM), for example. The magnetostrictive layers 350a and 350b (magnetostrictive films) are Ni—Fe type alloy films plated on the outer circumferential surface of the motor shaft 204. The thickness of each alloy film is preferably approximately 30 microns.

When the magnetostrictive layer 350a (magnetostrictive film) is thermally treated, the magnetostrictive layer 350a is heated by causing a high frequency current (e.g. 500 kHz to 2 MHz) to flow for a prescribed time (e.g. 1 to 10 seconds) through the first working coil (inductance element), while a first prescribed torque is applied to the motor shaft 204 in a prescribed direction (first direction). Further, when the magnetostrictive layer 350b (magnetostrictive film) is thermally treated, the magnetostrictive layer 350b is heated by causing the high frequency current to flow for the prescribed time through the second working coil (inductance element), while a second prescribed torque having the same magnitude as the first prescribed torque is applied to the motor shaft 204 in a direction (second direction) that is opposite the first direction.

The detection principles, basic configuration, and manufacturing method of a magnetostrictive torque sensor may be those described in Japanese Laid-Open Patent Publication No. 2004-340744, for example.

<A-2. Travel Modes>

In the present embodiment, a MOT travel mode, a hybrid travel mode, an ENG travel mode, and a regeneration mode are used. The MOT travel mode is a mode in which the traction motor 24 drives the vehicle 10 mainly using the power of the high voltage battery 30. The hybrid travel mode is a mode in which the generator 22 generates power according to the torque Teng of the engine 20, and the vehicle 10 is driven by the traction motor 24 using this generated power. The ENG travel mode is a mode in which travel is achieved using the engine 20 as the main drive source.

The MOT travel mode, the hybrid travel mode, and the ENG travel mode are selected mainly according to the travel drive force Fd of the vehicle 10 and the vehicle velocity V. The selection of each mode can be performed according to the standards described in Japanese Laid-Open Patent Publication No. 2017-100590. The MOT travel mode is used for low-velocity or medium-velocity travel and for low-velocity acceleration, for example. Furthermore, the hybrid travel mode is used for medium-velocity acceleration and for high-velocity sudden acceleration.

<A-3. Effects of the Present Embodiment>

According to the present embodiment, the torque sensor 50 is arranged inside the hollow portion 320 of the motor shaft 204 of the traction motor 24 (drive motor) (FIGS. 3 and 4). Therefore, compared to a case where the torque sensor 50 is arranged outside the motor shaft 204, it is easier to use the outer circumference of the motor shaft 204, such as by attaching the connecting portion 360 of the counter shaft 206 (other shaft) that engages with the motor shaft 204 to the second rotating electric machine 24 or the torque sensor 50 in a direction of the motor shaft 204. Accordingly, it is possible to improve the degree of design freedom of the traction motor 24 or the motor unit 80 including this traction motor 24, in the axial direction.

The torque sensor 50 is arranged inside the hollow portion 320 of the motor shaft 204, and therefore it is difficult for the torque sensor 50 to contact components (e.g. the counter shaft 206) arranged around the motor 24. Accordingly, it is easier to protect the torque sensor 50 from contact with these components.

Due to the cooling mechanism 52 including the pipe 510 arranged as part of the coolant flow path 504 inside the hollow portion 320, the traction motor 24 is cooled along with the torque sensor 50 (see FIGS. 3 and 4). Therefore, by cooling the traction motor 24 along with the torque sensor 50, it is possible to restrict temperature fluctuation of the torque sensor 50. Accordingly, the detection accuracy of the torque sensor 50 can be improved.

In the present embodiment, the cooling mechanism 52 includes the pipe 510 that allows the coolant to flow therethrough and is arranged inside the motor shaft 204 while also being secured to the motor housing 520 (stator side component) of the traction motor 24 (drive motor) (see FIGS. 3 and 4). Furthermore, the torque sensor 50 is a magnetostrictive torque sensor that includes the plurality of magnetostrictive layers 350a and 350b arranged on the inner circumferential surface of the output shaft 204 and the plurality of coils 352a and 352b arranged in the pipe 510 (see FIGS. 3 and 4). Due to this, the pipe 510 for the coolant can also serve as support for the coils 352a and 352b of the torque sensor 50.

In the present embodiment, the second through-hole 562 (through-hole) supplying the coolant is formed in the pipe 510 between the plurality of magnetostrictive layers 350a and 350b, in the axial direction of the traction motor 24 (drive motor) (see FIG. 4). Therefore, the coolant released from the second through-hole 562 of the pipe 510 is supplied between the plurality of magnetostrictive layers 350a and 350b, in the axial direction of the traction motor 24. As a result, it is possible to restrict unevenness in the supply of the coolant to the magnetostrictive layers 350a and 350b. Accordingly, it is possible to prevent a drop in the detection accuracy caused by temperature unevenness between the magnetostrictive layers 350a and 350b.

In the present embodiment, the first through-hole 560 is formed in the pipe 510 overlapping with the rotor 300 and the second through-hole 562 is formed in the pipe 510 overlapping with the plurality of magnetostrictive layers 350a and 350b, in the axial direction of the traction motor 24 (drive motor) (see FIG. 4). Furthermore, the motor shaft 204 includes the rotor shaft 310 secured to the rotor 300 and the protruding shaft 312 that protrudes from the rotor shaft 310. Yet further, the inner circumferential surface of the protruding shaft 312 on which the magnetostrictive layers 350a and 350b are formed is closer to the pipe 510 (or the rotational axis Ax) than the inner circumferential surface of the rotor shaft 310 is (see FIG. 3). In other words, in FIG. 3, the inner circumferential surface of the protruding shaft 312 and the inner circumferential surface of the rotor shaft 310 have a stepped shape.

Therefore, the coolant released to the rotor shaft 310 has difficulty reaching the magnetostrictive layers 350a and 350b. Accordingly, by supplying the coolant directly to the inner circumferential surface of the protruding shaft 312 from the second through-hole 562 of the pipe 510, it is possible to improve the efficiency of the cooling of the magnetostrictive layers 350a and 350b.

In the present embodiment, the vehicle 10 includes the motor unit 80 (see FIG. 1). Furthermore, the motor 24 (drive motor) is a traction motor that generates traction drive force of the vehicle 10 (see FIGS. 1 and 2). Due to this, by directly detecting the motor torque Ttrc (during driving) from the rotor 300 of the traction motor 24 or the regeneration torque Treg (during power generation) to the rotor 300, it is possible to detect the motor torque Ttrc (output torque) or the regeneration torque Treg (input torque) with high accuracy. Accordingly, the traction drive force of the vehicle 10 can be controlled with high accuracy.

B. Modifications

The present invention is not limited to the above embodiments, and it is obvious that various configurations can be adopted based on the content recorded in the specification. For example, the configurations shown below can be adopted.

<B-1. Applicable Targets>

The vehicle 10 according to the embodiments described above includes the engine 20, the generator 22, and the traction motor 24 (see FIG. 1). However, from the viewpoint of arranging the torque sensor 50 inside the hollow portion 320 of the motor shaft 204, for example, the present invention is not limited to this. For example, a configuration may be adopted to the vehicle 10 to include the engine 20 and one rotating electric machine, such as shown in FIG. 10 of Japanese Laid-Open Patent Publication No. 2017-100590. Alternatively, the vehicle 10 can be configured to include the engine 20 and three rotating electric machines. Alternatively, the vehicle 10 may be an electric vehicle that does not include the engine 20. If left and right wheels 28 (driven wheels) are each provided with a rotating electric machine (drive motor), these rotating electric machines may be configured as in-wheel motors. Alternatively, the present invention may be applied to a steering apparatus such as shown in Japanese Laid-Open Patent Publication No. 2008-017549.

<B-2. Rotating Electric Machine>

The first rotating electric machine 22 and the second rotating electric machine 24 according to the embodiments described above are each a three-phase brushless type. However, from the viewpoint of arranging the torque sensor 50 inside the hollow portion 320 of the motor shaft 204, for example, the present invention is not limited to this. The first rotating electric machine 22 and the second rotating electric machine 24 may be DC types or brush types.

The first rotating electric machine 22 and the second rotating electric machine 24 according to the embodiments described above are each an interior permanent magnet synchronous motor (IPMSM). However, from the viewpoint of arranging the torque sensor 50 inside the hollow portion 320 of the motor shaft 204, for example, the present invention is not limited to this. The first rotating electric machine 22 and the second rotating electric machine 24 may function as other types of rotating electric machines. These other types can be a surface permanent magnet synchronous motor (SPMSM), an inductance motor (IM), a switched reluctance motor (SRM), or a synchronous reluctance motor (SynRM), for example.

<B-3. Torque Sensor 50>

In the embodiments described above, the torque sensor 50 is a magnetostrictive type. However, from the viewpoint of arranging the torque sensor 50 inside the hollow portion 320 of the motor shaft 204, for example, the present invention is not limited to this. The torque sensor 50 can use another detection method, for example.

In the embodiments described above, the torque sensor 50 is provided at a position on the motor shaft 204 corresponding to the protruding shaft 312 (see FIGS. 3 and 4). In other words, in the embodiments described above, the torque sensor 50 is arranged at a position shifted from the rotor 300 in the axial direction of the traction motor 24. However, from the viewpoint of arranging the torque sensor 50 inside the hollow portion 320 of the motor shaft 204, for example, the present invention is not limited to this.

Figure 5:
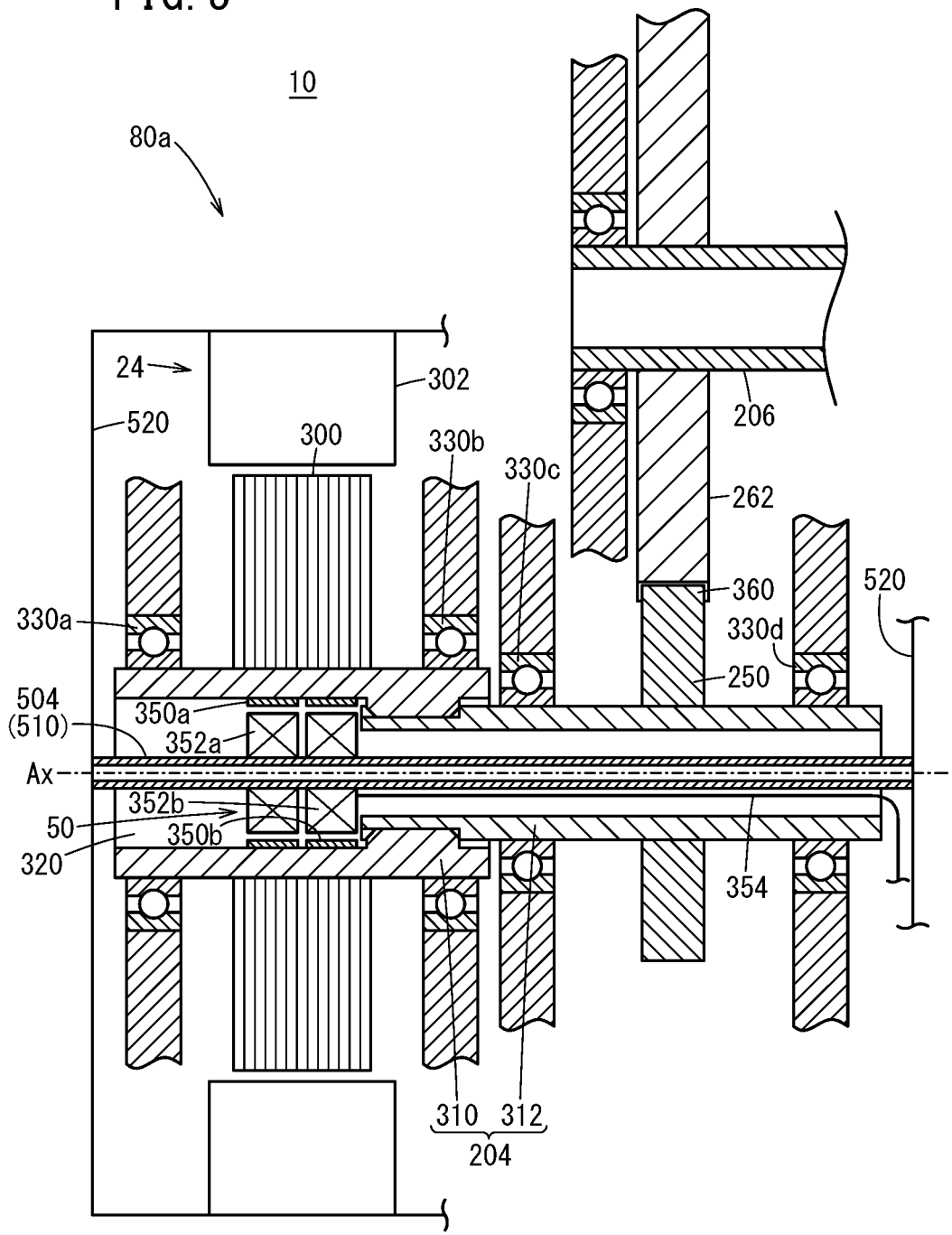
FIG. 5 is a cross-sectional view of a second rotating electric machine and a torque sensor of the motor unit, along with the surrounding region, according to a modification.

FIG. 5 is a cross-sectional view of the torque sensor 50 and the second rotating electric machine 24 of a motor unit 80a, and the surrounding region, according to a modification. In the motor unit 80a, the torque sensor 50 is arranged at a position overlapping with the rotor 300, in the axial direction of the traction motor 24 (drive motor). Due to this, by directly detecting the motor torque Ttrc (during driving) from the rotor 300 or the regeneration torque Treg (during power generation) to the rotor 300, the torque sensor 50 can detect the motor torque Ttrc (output torque) or the regeneration torque Treg (input torque) with high accuracy.

In the embodiments described above, the torque sensor 50 is arranged in the motor shaft 204 (see FIG. 3). However, from the viewpoint of detecting the torque in a torque transmission path (the entire third transmission path 76 and part of the first transmission path 70 in FIG. 1) connecting the traction motor 24 and the wheel 28, the present invention is not limited to this.

For example, the counter shaft 206 or the motor shaft 204 may be provided with a hollow portion, and the torque sensor 50 may be provided inside this hollow portion. Alternatively, from the viewpoint of arranging the torque sensor 50 inside the hollow portion of the output shaft of the drive motor (or rotating electric machine), the generator shaft 202 may be provided with a hollow portion and the torque sensor 50 may be provided inside this hollow portion. Alternatively, from the viewpoint of arranging the torque sensor 50 inside the hollow portion of the output shaft of the rotational drive source, the engine shaft 200 may be provide with a hollow portion and the torque sensor 50 may be arranged in this hollow portion. When changing the arrangement of the torque sensor 50 in the manner described above, the position of the pipe 510 may also be accordingly changed. Alternatively, from the viewpoint of arranging the torque sensor 50 inside the hollow portion and detecting the torsional torque acting on the shaft from inside the shaft, the torque sensor 50 (or the sensor unit 600) can be used in something other than the vehicle 10.

<B-4. Pipe 510 (Support Rod)>

In the embodiments described above, the pipe 510 is securely supported on the motor housing 520 (see FIG. 3). However, from the viewpoint of supporting the pipe 510 (or support rod), the present invention is not limited to this, and the pipe 510 may be supported by external components (components on the stator 302 side instead of the rotor 300 side, i.e. components that are not rotated due to the rotation of the rotor 300) other than the motor housing 520.

In the embodiments described above, both ends of the pipe 510 are securely supported by the motor housing 520 (see FIG. 3). However, from the viewpoint of arranging the torque sensor 50 inside the hollow portion 320 of the motor shaft 204, for example, the present invention is not limited to this. For example, in the case of a configuration where one end of the pipe 510 is arranged inside the motor shaft 204 and then the coolant flow path 504 is formed by the motor shaft 204 and the like, the pipe 510 may be supported by the motor housing 520 in a cantilevered manner.

In the embodiments described above, the pipe 510 of the cooling mechanism 52 is a support member (support rod) for the coils 352a and 352b of the torque sensor 50 (see FIGS. 3 and 4). However, from the viewpoint of arranging the torque sensor 50 inside the hollow portion 320 of the motor shaft 204, for example, the present invention is not limited to this. For example, a support rod other than the pipe 510 may support the coils 352a and 352b.

In the embodiments described above, the motor shaft 204 and the cooling mechanism 52 (pipe 510) are provided separately (see FIG. 3). However, from the viewpoint of cooling the traction motor 24, for example, the present invention is not limited to this. For example, it is possible to use the hollow portion 320 of the motor shaft 204 as the coolant flow path 504.

What is claimed is:

1. A motor unit comprising:
a drive motor that includes an output shaft having a hollow portion;
a torque sensor arranged within the hollow portion; and
a cooling mechanism that has one end of a coolant path arranged inside the hollow portion and cools the drive motor and the torque sensor,
wherein the cooling mechanism includes a pipe that is secured to a stator-side component of the drive motor, is arranged inside the output shaft, and allows a coolant to flow through the pipe, and
wherein the torque sensor is a magnetostrictive torque sensor that includes a plurality of magnetostrictive layers arranged on an inner circumferential surface of the output shaft, and a plurality of coils arranged in the pipe.

2. The motor unit according to claim 1, wherein a through-hole that supplies the coolant between the plurality of magnetostrictive layers, in an axial direction of the drive motor, is formed in the pipe.

3. The motor unit according to claim 1, wherein the output shaft includes a rotor shaft secured to a rotor of the drive motor, and a protruding shaft that protrudes from the rotor shaft, the magnetostrictive layers are formed on an inner circumferential surface of the protruding shaft, a first through-hole overlapping with the rotor of the drive motor and a second through-hole overlapping with the plurality of magnetostrictive layers, in an axial direction of the drive motor, are formed in the pipe, and the protruding shaft is closer to the pipe than the inner circumferential surface of the rotor shaft is.

4. A vehicle comprising a motor unit comprising: a drive motor that includes an output shaft having a hollow portion; a torque sensor arranged within the hollow portion; and a cooling mechanism that has one end of a coolant path arranged inside the hollow portion and cools the drive motor and the torque sensor, wherein the drive motor is a traction motor that generates a traction drive force of the vehicle or a generator that generates power based on a drive force of an internal combustion engine of the vehicle, wherein the cooling mechanism includes a pipe that is secured to a stator-side component of the drive motor, is arranged inside the output shaft, and allows a coolant to flow through the pipe, and wherein the torque sensor is a magnetostrictive torque sensor that includes a plurality of magnetostrictive layers arranged on an inner circumferential surface of the output shaft, and a plurality of coils arranged in the pipe.

* * * * *